United States Patent
Alnafi (10) Patent No.: US 11,592,486 B2
(45) Date of Patent: Feb. 28, 2023

(54) ELECTROMECHANICAL RELAY TESTER

(71) Applicant: SAUDI ARABIAN OIL COMPANY, Dhahran (SA)

(72) Inventor: Meshari Sulaiman Alnafi, Yanbu (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 280 days.

(21) Appl. No.: 16/894,175

(22) Filed: Jun. 5, 2020

(65) Prior Publication Data
US 2021/0382113 A1    Dec. 9, 2021

(51) Int. Cl.
*G01R 31/327*  (2006.01)
*G05B 19/042*  (2006.01)
*H03K 17/18*  (2006.01)

(52) U.S. Cl.
CPC ..... *G01R 31/3278* (2013.01); *G01R 31/3274* (2013.01); *G05B 19/0428* (2013.01); *H03K 17/18* (2013.01); *G05B 2219/23278* (2013.01); *G05B 2219/2609* (2013.01)

(58) Field of Classification Search
CPC .... G01R 31/00; G01R 31/3275; G01R 31/18; G05B 19/0428
See application file for complete search history.

(56) References Cited

U.S. PATENT DOCUMENTS

| | | | |
|---|---|---|---|
| 4,845,594 A * | 7/1989 | Wilkerson | H02H 3/48 361/96 |
| 5,451,879 A | 9/1995 | Moore | |
| 5,878,375 A * | 3/1999 | Newton | G01R 31/3275 361/81 |
| 6,377,051 B1 | 4/2002 | Tyner et al. | |
| 9,086,447 B1 | 7/2015 | Ledbetter, III et al. | |
| 2002/0105336 A1* | 8/2002 | Swale | G01R 31/52 324/508 |
| 2003/0132752 A1* | 7/2003 | Johnson | G01R 31/3278 324/418 |

(Continued)

FOREIGN PATENT DOCUMENTS

| CN | 2620283 Y | 6/2004 |
|---|---|---|
| CN | 202758011 U | 2/2013 |

(Continued)

OTHER PUBLICATIONS

International Search Report for corresponding International Application No. PCT/US2020/040278, dated Feb. 8, 2021 (6 pages).

(Continued)

*Primary Examiner* — Jermele M Hollington
*Assistant Examiner* — Temilade S Rhodes-Vivour
(74) *Attorney, Agent, or Firm* — Osha Bergman Watanabe & Burton LLP (57) ABSTRACT

A method for automatically testing a relay is provided. The method includes applying power to a testing device for automatically testing the relay, determining a position of a selector switch based on a user selection for testing, selectively energizing the relay based on the position of the selector switch, detecting, by a hardware processor, an energize status signal from the selector switch, testing, by the hardware processor and based at least on the energize status signal, a control coil or a contact of the relay to generate a test result, and displaying, using display, the energize status signal and the test result.

18 Claims, 5 Drawing Sheets

(56) References Cited

U.S. PATENT DOCUMENTS

| | | | |
|---|---|---|---|
| 2005/0104597 A1 | 5/2005 | Klijn et al. | |
| 2006/0076958 A1 | 4/2006 | Deak et al. | |
| 2014/0354287 A1 | 12/2014 | Eziyi | |
| 2015/0130274 A1* | 5/2015 | Bissontz | B60L 3/04 307/10.1 |
| 2015/0135016 A1* | 5/2015 | Glaser | G06F 11/0709 714/37 |
| 2016/0124048 A1 | 5/2016 | Ashtekar et al. | |
| 2018/0143251 A1 | 5/2018 | Tili | |
| 2019/0162788 A1 | 5/2019 | Wight et al. | |

FOREIGN PATENT DOCUMENTS

| | | |
|---|---|---|
| CN | 203759530 U | 8/2014 |
| CN | 104515929 A | 4/2015 |
| CN | 204479711 U | 7/2015 |
| CN | 106707158 A | 5/2017 |
| CN | 106772017 A | 5/2017 |
| CN | 109459689 A | 3/2019 |
| CN | 109696625 A | 4/2019 |
| CN | 110658449 A | 1/2020 |
| CN | 111157885 A | 5/2020 |
| KR | 20070095084 A | 9/2007 |
| KR | 200468427 Y1 | 8/2013 |
| KR | 101443245 B1 | 9/2014 |

OTHER PUBLICATIONS

Written Opinion for corresponding International Application No. PCT/US2020/040278, dated Feb. 8, 2021 (11 pages).

* cited by examiner

ELECTROMECHANICAL RELAY TESTER

BACKGROUND

A relay is an electrically operated switch that has a single or multiple control signals, and a set of operating contact terminals. Many types of relay exist that use various control signal formats, such as direct current (DC), alternating current (AC), 5 volts, 12 volts, 24 volts, 120 volts, etc. The relay may have any number of contacts in multiple contact forms, such as normally open (NO) contacts, normally closed (NC) contacts, or combinations thereof. An electromechanical relay is a relay that uses an electromagnet to close or open the contacts.

SUMMARY

In general, in one aspect, the invention relates to a method for automatically testing a relay. The method includes applying power to a testing device for automatically testing the relay, determining a position of a selector switch based on a user selection for testing, selectively energizing the relay based on the position of the selector switch, detecting, by a hardware processor, an energize status signal from the selector switch, testing, by the hardware processor and based at least on the energize status signal, a control coil or a contact of the relay to generate a test result, and displaying, using display, the energize status signal and the test result.

In general, in one aspect, the invention relates to a testing device for testing a relay. The testing device includes an ON/OFF switch for applying power to the testing device for automatically testing the relay, an energize test selector switch for selectively energizing the relay based on a position of the energize test selector switch, wherein the position is determined based on a user selection for testing, a processor and a memory coupled to the processor, the memory storing instructions, when executed by the processor, comprising functionality for detecting an energize status signal from the energize test selector switch, and testing, based at least on the energize status signal, a control coil or a contact of the relay to generate a test result, and a display for displaying the energize status signal and the test result.

In general, in one aspect, the invention relates to a non-transitory computer readable medium (CRM) storing instructions executable by a computer processor for testing a relay. The instructions, when executed by the computer processor, including functionality for applying power to a testing device for automatically testing the relay, determining a position of a selector switch based on a user selection for testing, selectively energizing the relay based on the position of the selector switch, detecting an energize status signal from the selector switch, testing, based at least on the energize status signal, a control coil or a contact of the relay to generate a test result, and displaying, using a display, the energize status signal and the test result.

Other aspects and advantages will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

DETAILED DESCRIPTION

Specific embodiments of the disclosure will now be described in detail with reference to the accompanying figures. Like elements in the various figures are denoted by like reference numerals for consistency.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Embodiments of the invention provide a method, a system, and a non-transitory computer readable medium for testing a relay. In one or more embodiments, the invention is implemented as a portable electronics apparatus that has an electronic controller for testing an industrial electromechanical relay's coil(s) and contacts where the test results are displayed using a liquid crystal display (LCD). For example, the industrial electromechanical relay may be a standard 11-pin relay. The portable electronic apparatus of the present invention is able to test the relay in either a de-energized or an energized state.

Figure 1:
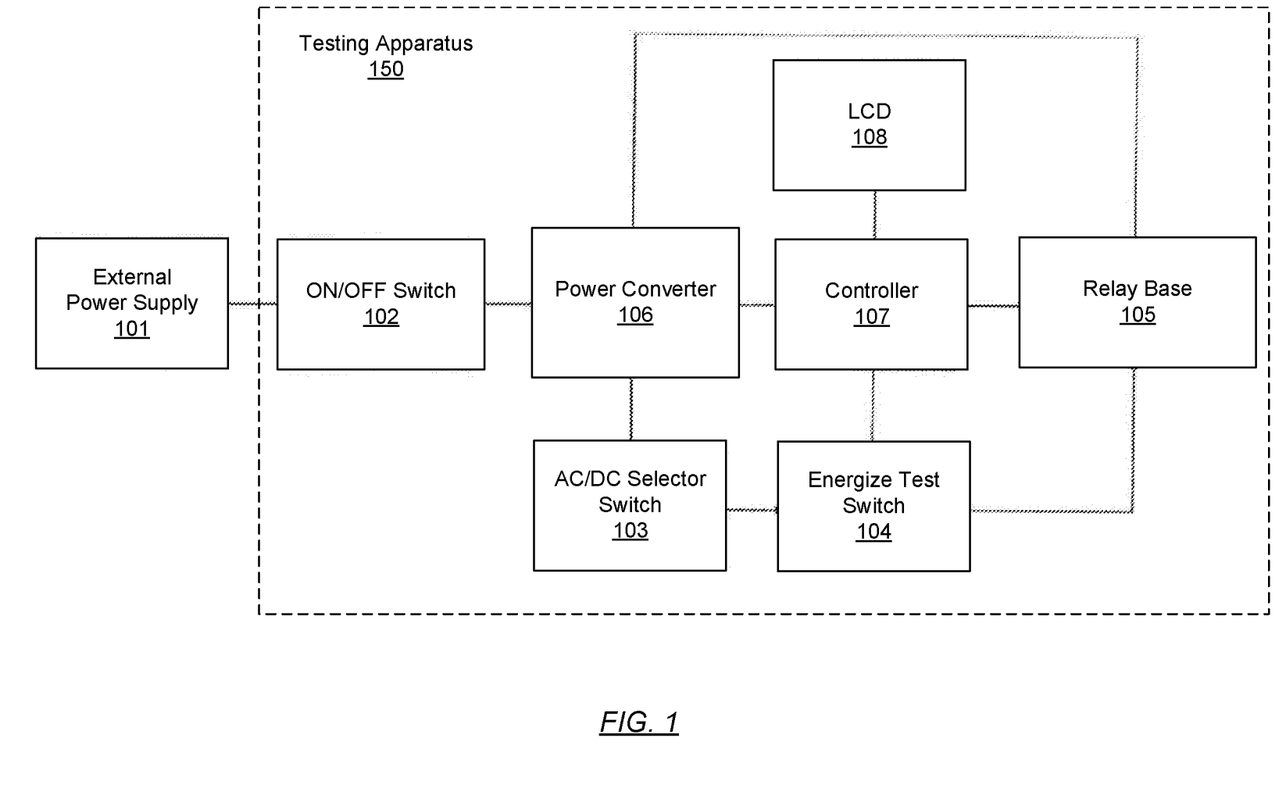
FIGS. 1 and 2 show schematic diagrams in accordance with one or more embodiments.

Turning to FIG. 1, FIG. 1 shows a schematic block diagram in accordance with one or more embodiments. In one or more embodiments, one or more of the modules and/or elements shown in FIG. 1 may be omitted, repeated, and/or substituted. Accordingly, embodiments of the invention should not be considered limited to the specific arrangements of modules and/or elements shown in FIG. 1.

As shown in FIG. 1, FIG. 1 illustrates an external power supply (101) and a testing apparatus (150) for testing a relay. When the relay is connected to the testing apparatus (150) during testing, the relay is referred to as the relay-under-test. The testing apparatus (150) is a testing device that includes an ON/OFF switch (102), an AC/DC switch (103), an energize test selector switch (104), a relay base (105), a power converter (106), a controller (107), and an LCD (108). In one or more embodiments, these components of the testing device are interconnected and collectively housed in a mechanical enclosure. The external power supply (101) is a source of electrical power for the testing apparatus (150). For example, the electrical power source may be a power outlet, a power strip, a step-down power transformer, etc. that is connected to the testing apparatus (150) via a detachable power cord (not shown). The ON/OFF switch (102) is an electrical switch activated by a user to turn on or turn off the electrical power to the testing apparatus (150). The AC/DC switch (103) is an electrical switch activated by the user to selectively apply the required AC or DC voltage (e.g., 120 VAC or 120 VDC) to energize a relay-under-test. The energize test selector switch (104) is an electrical switch activated by the user to selectively perform the relay testing where the relay-under-test is either in the de-energized state or the energized state. The relay base (105) is a connector for connecting the relay-under-test to the testing apparatus (150). For example, the relay base (105) may be a socket having female pins where male pins of the relay-under-test are inserted to make electrical connections. The power converter (106) is an electrical circuit configured to convert the electrical voltage from the external power supply (101) into the operating voltage of the controller (107), the relay base (105), and the LCD (108). For example, the power converter (106) may be a pulse-density-modulation (PDM) power converter. The controller (107) is a device configured to perform the relay testing by measuring the relay-under-test and controlling the LCD (108) to display results of the relay testing. In one or more embodiments of the invention, the controller (107) is implemented in hardware (i.e., circuitry), software, or any combination thereof. For example, the controller (107) may be implemented based on the computing system described in reference to FIGS. 5A and 5B below.

Figure 5A:
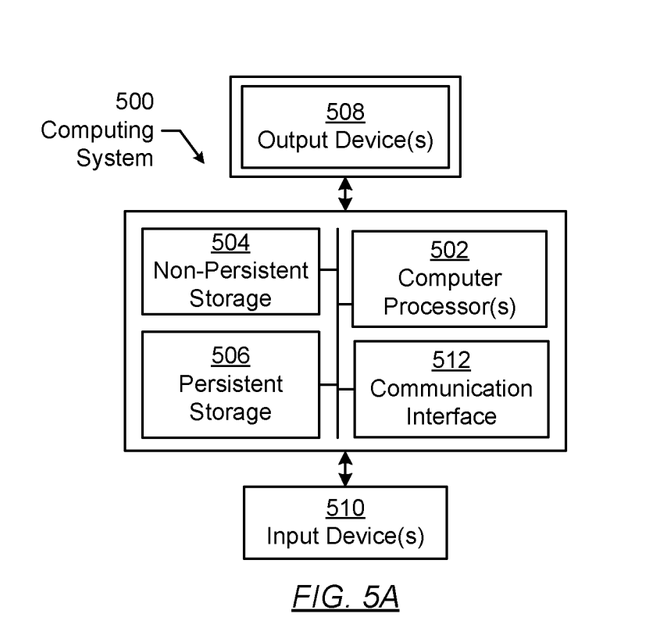
FIGS. 5A and 5B show a computing system in accordance with one or more embodiments.

An example circuit diagram of the testing apparatus (150) is described in reference to FIG. 2 below. In one or more embodiments, the testing apparatus (150) performs the functions described above using the method described in reference to FIG. 3 below. An example of the testing apparatus (150) is shown in FIG. 5 below.

Figure 2:
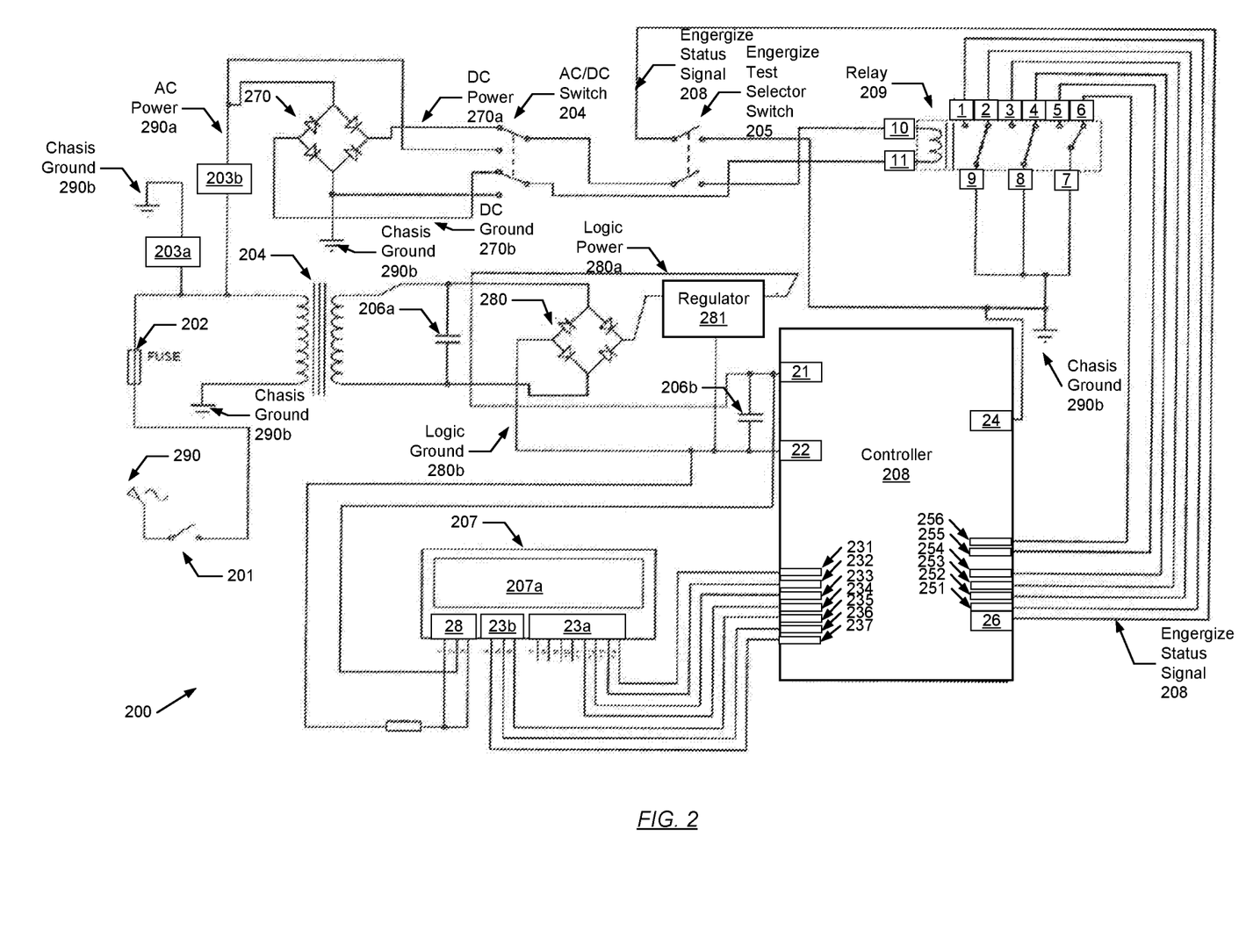

Turning to FIG. 2, FIG. 2 shows a schematic circuit diagram in accordance with one or more embodiments. In one or more embodiments, one or more of the modules and/or elements shown in FIG. 2 may be omitted, repeated, and/or substituted. Accordingly, embodiments of the invention should not be considered limited to the specific arrangements of modules and/or elements shown in FIG. 2.

As shown in FIG. 2, FIG. 2 illustrates an example circuit diagram (200) of the testing apparatus (150) depicted in FIG. 1 above. In the example circuit diagram (200), the external power supply (290), ON/OFF switch (201), AC/DC switch (204), energize test selector switch (205), controller (208), and LCD (207) are examples of the ON/OFF switch (102), AC/DC switch (103), energize test selector switch (104), controller (107), and LCD (108), respectively, depicted in FIG. 1 above. In addition, the relay (209) is an example of the relay-under-test that is inserted into the relay base (105) depicted in FIG. 1 above. Remaining elements of the circuit diagram (200) collectively form an example of the power converter (106) depicted in FIG. 1 above. Further details of the circuit diagram (200) are described below.

Starting from the left-hand side of the circuit diagram (200), the ON/OFF switch (201), when switched on, transmits electrical power from the external power supply (290) to the transformer (204) and the bridge rectifier (270) via the fuse (202) and indication light for the electrical power supply (203a), (203b) (e.g., protection diodes). The ON/Off switch (201) is a single pole single throw switch having two terminals that are connected or disconnected in response to a user action. The transformer (204) couples the electrical power to a second bridge rectifier (280) that powers the regulator (281) to generate the logic power (280a) referenced to the logic ground (280b). The logic power (280a) and logic ground (280b) are connected to the controller (208) at pins (21) and (22), and to the LCD (207) at respective power pins (28). Capacitors (206a) and (206b) facilitate the bridge rectifier (280) and the regulator (281) to generate the logic power (280a) referenced to the logic ground (280b). For example, the logic power (280a) referenced to the logic ground (280b) may correspond to a DC voltage with a magnitude of 5 volts, 12 volts, or other voltage levels compatible with the operating requirements of the controller (208) and the LCD (207).

The bridge rectifier (270) receives the AC power (290a) referenced to the chasis ground (290b) to generate the DC power (270a) referenced to the DC ground (270b). The AC/DC switch (204) selectively transmits either the DC power (270a) referenced to the DC ground (270b) or the AC power (290a) referenced to the chasis ground (290b) to the energize test selector switch (205) and the relay (209). The electrical connections between the relay (209) and AC/DC switch (204), the energize test selector switch (205), and the controller (208) are based on individual wirings from the pins of the relay base (105) to other modules depicted in FIG. 1.

Depending on the operating requirement of the relay (209), the AC/DC switch (204) is activated by a user to transmit either the DC voltage or the AC voltage to energize the relay (209). The AC/DC switch (204) is a double pole double throw switch that connects a pair of output terminals to either one of two pairs of input terminals in response to a user action. The AC/DC switch (204) is shown in FIG. 2 as activated (i.e. indicated by the dash line) to transmit the DC power (270a) referenced to the DC ground (270b) to the energize test selector switch (205) and the relay (209).

The energize test selector switch (205) is a single pole single throw switch having two terminals that are connected or disconnected in response to a user action. The energize test selector switch (205) is activated by the user to select either the de-energized test mode or the energized test mode for testing the relay (209). The energize test selector switch (205) is shown in FIG. 2 as activated open (i.e. indicated by the dash line) to perform the relay testing in the de-energize test mode. Specifically, the coil of the relay (209) is de-energized because pin (10) of the relay (209) is disconnected from the AC/DC switch (204) by the energize test selector switch (205).

In contrast, when the energize test selector switch (205) is closed (i.e., the dash line moves downward) to perform the relay testing in the energized test mode, the coil of the relay (209) is energized because both pin (10) and pin (11) of the relay (209) are connected to the AC/DC switch (204) by the energize test selector switch (205). For the type of the relay (209) that requires DC voltage to operate the control coil, the pin (10) and pin (11) of the relay (209) receive the DC power (270a) referenced to the DC ground (270b), as shown in FIG. 2. For the type of the relay (209) that requires AC voltage to operate the control coil, the AC/DC switch (204) is activated differently (i.e., the dash line moves downward). Accordingly, the pin (10) and pin (11) of the relay (209) receive the AC power (290a) referenced to the chasis ground (290b), opposite to what is shown in FIG. 2.

Additional pins (10) through (9) of the relay (209) are contact pins that are controlled by the control coil. The pins (7), (8), and (9) are connected to the chasis ground (290b). The pins (7), (8), and (9), and the pins (2), (4), and (6) collectively form 3 sets of normally closed (NC) contact points. In other words, when the control coil is de-energized as shown in FIG. 2, the pins (2), (4), and (6) are internally connected to the pins (7), (8), and (9), respectively, within the relay (209). When the control coil is energized (i.e., the dash line moves downward), the pins (2), (4), and (6) are internally disconnected from the pins (7), (8), and (9), respectively, within the relay (209).

In contrast, the pins (7), (8), and (9), and the pins (1), (2), and (3) collectively form 3 sets of normally open (NC) contact points. In other words, when the control coil is de-energized as shown in FIG. 2, the pins (1), (3), and (5) are internally disconnected from the pins (7), (8), and (9), respectively, within the relay (209). When the control coil is energized (i.e., the dash line moves downward), the pins (1), (3), and (5) are internally connected to the pins (7), (8), and (9), respectively, within the relay (209).

As noted above, pin (21) and pin (22) of the controller (208) are connected to the logic power (280a) and the logic ground (280b). In addition, the controller (208) has pins (231) through (237) connected to the LCD (207), pin (24) connected to the chasis ground (290b), pins (251) through (256) connected to the pins (1) through (6) of the relay (209), and pin (26) connected to one terminal of the energize test selector switch (205). In particular, the pin (26) and the connected terminal of the energize test selector switch (205) transmits an energize status signal (208) from the energize test selector switch (205) to the controller (208). Further functionality of the pins of the controller (208) are described in detail below.

During the relay testing with the relay (209) in the de-energized state, as shown in FIG. 2, the AC/DC switch (204) is activated according to the operating requirement of the control coil of the relay (209). Accordingly, the pins (2), (4), and (6) are connected to the chasis ground (290b) via the pins (7), (8), and (9), respectively. In addition, the pins (1), (3), and (5) have no electrical connections and have indeterminate voltage levels as they are internally disconnected from the pins (7), (8), and (9), respectively. Therefore, the controller (208) senses the voltage levels of pins (251), (252), (253), (254), (255), and (256) as the pattern (F, 0, F, 0, F, 0), where F denote the indeterminate voltage level and 0 denotes the ground voltage level. Further, pin (26) of the controller (208) is disconnected by the energize test selector switch (205). In other words, the energize status signal (208) corresponds to the indeterminate voltage level as received by the controller (208). Any deviation from the pattern (F, 0, F, 0, F, 0) sensed on the pins (251) through (256) indicates a failure condition on the corresponding pin(s) of the relay (209) in the de-energized state.

During the relay testing with the relay (209) in the energized state (i.e., the dash line moves downward), the AC/DC switch (204) is activated according to the operating requirement of the control coil of the relay (209). Accordingly, the pins (1), (3), and (5) are connected to the chasis ground (290b) via the pins (7), (8), and (9), respectively. In addition, the pins (2), (4), and (6) have no electrical connections and have indeterminate voltage levels as they are internally disconnected from the pins (7), (8), and (9), respectively. Therefore, the controller (208) senses the voltage levels of pins (251), (252), (253), (254), (255), and (256) as the pattern (0, F, 0, F, 0, F). Further, pin (26) of the controller (208) is connected to the chasis ground (290b) by the energize test selector switch (205). In other words, the energize status signal (208) corresponds to the ground voltage level as received by the controller (208). Any deviation from the pattern (0, F, 0, F, 0, F) sensed on the pins (251) through (256) indicates a failure condition on the corresponding pin(s) of the relay (209) in the energized state.

In either the de-energized testing mode or the energized testing mode, pins (231) through (237) of the controller (208) are used to communicate with the LCD (207) to display the test results. In particular, pins (231), (232), (233), and (234) are connected to data input/output pins (23a) of the LCD (207), while pins (235), (236), and (237) are connected to command signal pins (23b) of the LCD (207). In one or more embodiments, the data input/output pins (23a) are configured to send and receive date nibbles (i.e., 4-digit data items) to/from the controller (208) based on read/write cycles determined by the command signal pins (23b) of the LCD (207).

Figure 3:
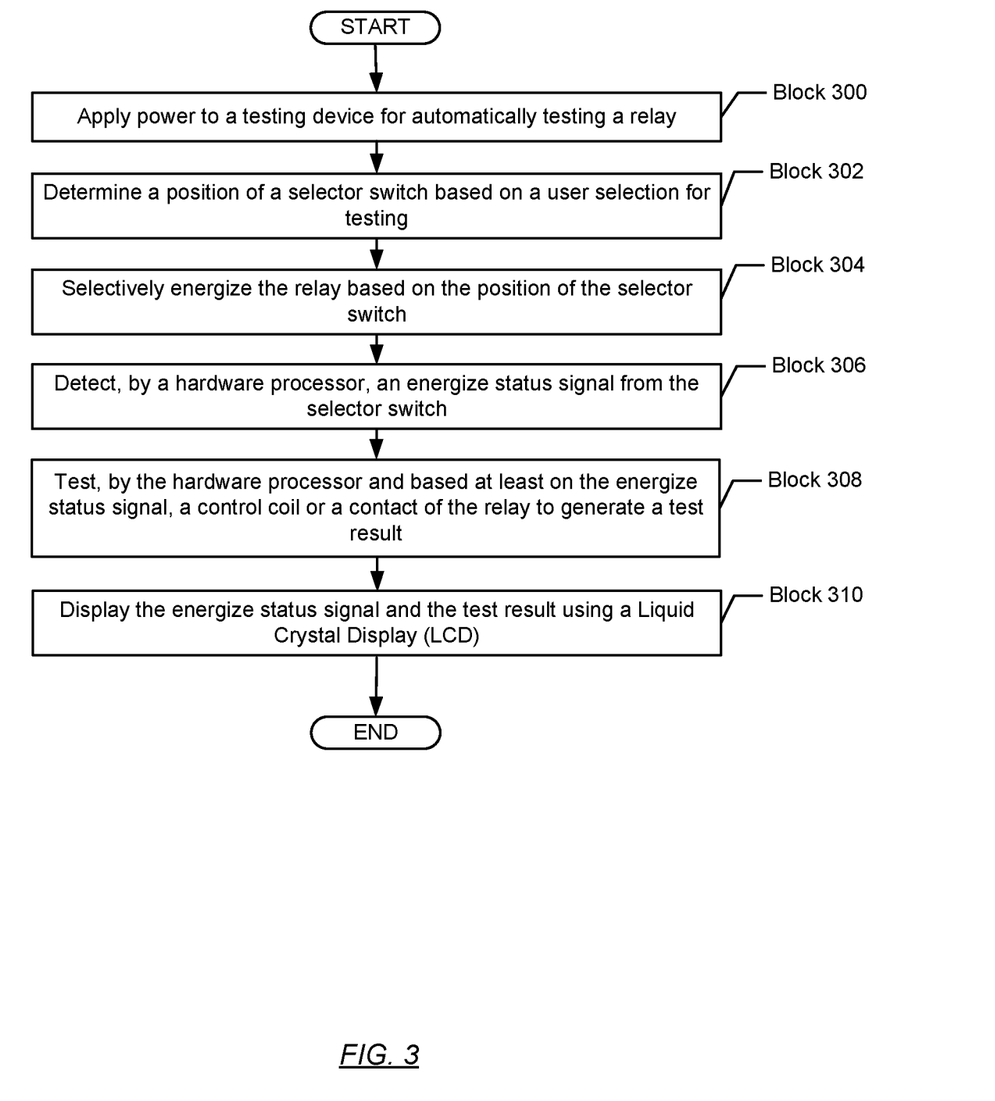
FIG. 3 shows a flowchart in accordance with one or more embodiments.

Turning to FIG. 3, FIG. 3 shows a flowchart in accordance with one or more embodiments. Specifically, FIG. 3 describes a method for testing a relay. One or more blocks in FIG. 3 may be performed using one or more components as described in FIGS. 1-2. While the various blocks in FIG. 3 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

Initially in Block 300, electrical power is applied to a testing device for automatically testing the relay.

In Block 302, a position of a selector switch is determined based on a user selection for testing.

In Block 304, the relay, more specifically the control coil of the relay, is selectively energized based on the position of the selector switch. In one or more embodiment, selectively energizing the relay is by determining a position of an AC/DC switch based on a further user selection for energizing the relay, and applying a control voltage to the relay based on the position of the AC/DC switch.

In Block 306, an energize status signal is detected by a hardware processor from the selector switch.

In Block 308, a control coil or a contact of the relay is tested by the hardware processor based at least on the energize status signal to generate a test result.

In Block 310, the energize status signal and the test result are displayed using a Liquid Crystal Display (LCD).

In addition to the coil or the contact that are tested above, any additional coil or additional contact of the relay are identified for testing. In response to said identifying, the additional coil or the additional contact are tested to generate an additional test result. Accordingly, the energize status signal and the test result of all contacts are simultaneously displayed using the LCD.

Figure 4:
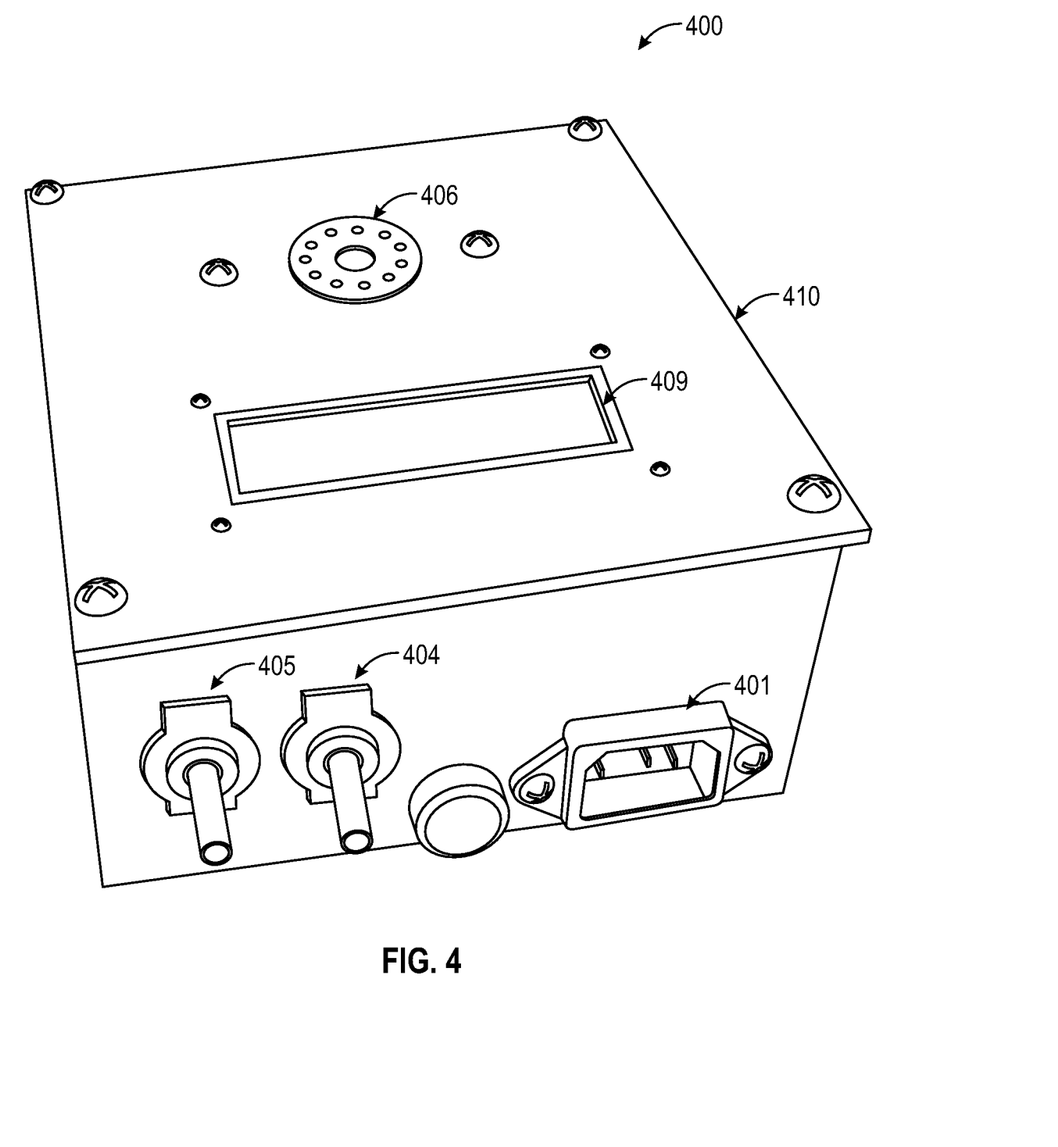
FIG. 4 shows an example in accordance with one or more embodiments.

Turning to FIG. 4, FIG. 4 provides an example of an improved relay testing apparatus. The example shown in FIG. 4 may be, for example, based on one or more components depicted in FIGS. 1-2 above and the method flowchart depicted in FIG. 3 above. In one or more embodiments, one or more of the modules and/or elements shown in FIG. 4 may be omitted, repeated, and/or substituted. Accordingly, embodiments of the invention should not be considered limited to the specific arrangements of modules and/or elements shown in FIG. 4.

As shown in FIG. 4, FIG. 4 illustrates a photograph of an example testing apparatus (400) that is fully assembled inside an enclosure (410). Specifically, the photograph shows an AC/DC switch (404), an energize test selector switch (405), a relay base (406), and an LCD (409) that are examples of the AC/DC switch (103), energize test selector switch (104), relay base (105), and LCD (108), respectively, depicted in FIG. 1 above. In addition, the photograph shows a power connector (401) where an external power cord may be inserted to connect to a power source, such as a power outlet, power strip, step down transformer, etc. The enclosure (410) may be made of a metal material and electrically connected to the chasis ground (290b) depicted in FIG. 2 above.

Embodiments may be implemented on a computing system. Any combination of mobile, desktop, server, router, switch, embedded device, or other types of hardware may be used. For example, as shown in FIG. 5A, the computing system (500) may include one or more computer processors (502), non-persistent storage (504) (e.g., volatile memory, such as random access memory (RAM), cache memory), persistent storage (506) (e.g., a hard disk, an optical drive such as a compact disk (CD) drive or digital versatile disk (DVD) drive, a flash memory, etc.), a communication interface (512) (e.g., Bluetooth interface, infrared interface, network interface, optical interface, etc.), and numerous other elements and functionalities.

The computer processor(s) (502) may be an integrated circuit for processing instructions. For example, the computer processor(s) may be one or more cores or micro-cores of a processor. The computing system (500) may also include one or more input devices (510), such as a touchscreen, keyboard, mouse, microphone, touchpad, electronic pen, or any other type of input device.

The communication interface (512) may include an integrated circuit for connecting the computing system (500) to a network (not shown) (e.g., a local area network (LAN), a wide area network (WAN) such as the Internet, mobile network, or any other type of network) and/or to another device, such as another computing device.

Further, the computing system (500) may include one or more output devices (505), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (502), non-persistent storage (504), and persistent storage (506). Many different types of computing systems exist, and the aforementioned input and output device(s) may take other forms.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the disclosure.

Figure 5B:
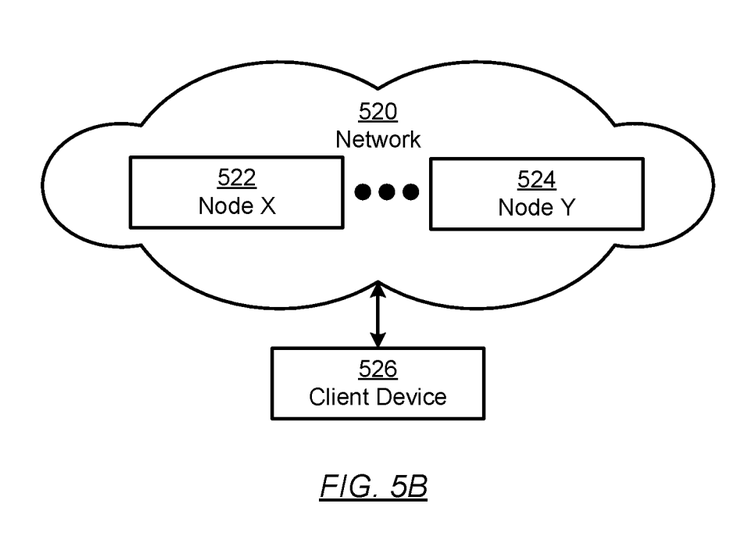

The computing system (500) in FIG. 5A may be connected to or be a part of a network. For example, as shown in FIG. 5B, the network (520) may include multiple nodes (e.g., node X (522), node Y (524)). Each node may correspond to a computing system, such as the computing system shown in FIG. 5A, or a group of nodes combined may correspond to the computing system shown in FIG. 5A. By way of an example, embodiments of the disclosure may be implemented on a node of a distributed system that is connected to other nodes. By way of another example, embodiments of the disclosure may be implemented on a distributed computing system having multiple nodes, where each portion of the disclosure may be located on a different node within the distributed computing system. Further, one or more elements of the aforementioned computing system (500) may be located at a remote location and connected to the other elements over a network.

Although not shown in FIG. 5B, the node may correspond to a blade in a server chassis that is connected to other nodes via a backplane. By way of another example, the node may correspond to a server in a data center. By way of another example, the node may correspond to a computer processor or micro-core of a computer processor with shared memory and/or resources.

The nodes (e.g., node X (522), node Y (524)) in the network (520) may be configured to provide services for a client device (526). For example, the nodes may be part of a cloud computing system. The nodes may include functionality to receive requests from the client device (526) and transmit responses to the client device (526). The client device (526) may be a computing system, such as the computing system shown in FIG. 5A. Further, the client device (526) may include and/or perform all or a portion of one or more embodiments of the disclosure.

The computing system or group of computing systems described in FIGS. 5A and 5B may include functionality to perform a variety of operations disclosed herein. For example, the computing system(s) may perform communication between processes on the same or different systems. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to a couple of these non-limiting examples are provided below.

Based on the client-server networking model, sockets may serve as interfaces or communication channel endpoints enabling bidirectional data transfer between processes on the same device. Foremost, following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process, the client process starts by creating a second socket object. The client process then proceeds to generate a connection request that includes at least the second socket object and the unique name and/or address associated with the first socket object. The client process then transmits the connection request to the server process. Depending on availability, the server process may accept the connection request, establishing a communication channel with the client process, or the server process, busy in handling other operations, may queue the connection request in a buffer until the server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred, more commonly, as datagrams or a stream of characters (e.g., bytes).

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, one authorized process may mount the shareable segment, other than the initializing process, at any given time.

Other techniques may be used to share data, such as the various data described in the present application, between processes without departing from the scope of the disclosure. The processes may be part of the same or different application and may execute on the same or different computing system.

Rather than or in addition to sharing data between processes, the computing system performing one or more embodiments of the disclosure may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments of the disclosure, may extract one or more data items from the obtained data. For example, the extraction may be performed as follows by the computing system (500) in FIG. 5A. First, the organizing pattern (e.g., grammar, schema, layout) of the data is determined, which may be based on one or more of the following: position (e.g., bit or column position, Nth token in a data stream, etc.), attribute (where the attribute is associated with one or more values), or a hierarchical/tree structure (consisting of layers of nodes at different levels of detail—such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 5A, while performing one or more embodiments of the disclosure, may perform data comparison. Data comparison may be used to compare two or more data values (e.g., A, B). For example, one or more embodiments may determine whether A>B, A=B, A !=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A-B), and the status flags may be read to determine if the result is positive (i.e., if A>B, then A-B>0). In one or more embodiments, B may be considered a threshold, and A is deemed to satisfy the threshold if A=B or if A>B, as determined using the ALU. In one or more embodiments of the disclosure, A and B may be vectors, and comparing A with B includes comparing the first element of vector A with the first element of vector B, the second element of vector A with the second element of vector B, etc. In one or more embodiments, if A and B are strings, the binary values of the strings may be compared.

The computing system in FIG. 5A may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or data container (database, table, record, column, view, etc.), identifier(s), conditions (comparison operators), functions (e.g. join, full join, count, average, etc.), sort (e.g. ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 5A may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions presents only a few examples of functions performed by the computing system of FIG. 5A and the nodes and/or client device in FIG. 5B. Other functions may be performed using one or more embodiments of the disclosure.

While the disclosure has been described with respect to a limited number of embodiments, those skilled in the art, having benefit of this disclosure, will appreciate that other embodiments can be devised which do not depart from the scope of the disclosure as disclosed herein. Accordingly, the scope of the disclosure should be limited only by the attached claims.

Although the preceding description has been described herein with reference to particular means, materials and embodiments, it is not intended to be limited to the particulars disclosed herein; rather, it extends to all functionally equivalent structures, methods and uses, such as are within the scope of the appended claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed is:

1. A method for automatically testing a relay, the method comprising:
    applying power to a testing device for automatically testing the relay;
    determining a position of a selector switch based on a user selection for testing;
    selectively energizing the relay based on the position of the selector switch, comprising:
        determining a position of an AC/DC switch based on a further user selection for energizing the relay, and
        applying a control voltage to the relay based on the position of the AC/DC switch;
    detecting, by a hardware processor, an energize status signal from the selector switch;
    testing, by the hardware processor and based at least on the energize status signal, a control coil or a contact of the relay to generate a test result; and
    displaying, using display, the energize status signal and the test result.

2. The method according to claim 1, further comprising:
    identifying an additional coil or an additional contact of the relay for testing; testing, in response to said identifying, the additional coil or the additional contact to generate an additional test result; and
    further displaying, contemporaneously with displaying the energize status signal and the test result, the additional test result.

3. The method according to claim 1, wherein the relay comprises 11 pins.

4. The method according to claim 1, wherein the position of the selector switch comprises an energized test position and a de-energized test position.

5. The method according to claim 1, wherein the position of the AC/DC switch comprises an AC control voltage position and a DC control voltage position.

6. The method according to claim 5, wherein the control voltage comprises a 120 VAC voltage based on the AC control voltage position and a 120 VDC voltage based on the DC control voltage position.

7. A testing device for testing a relay, comprising:
    an ON/OFF switch for applying power to the testing device for automatically testing the relay;
    an energize test selector switch for selectively energizing the relay based on a position of the energize test selector switch, wherein the position of the energize test selector switch is determined based on a user selection for testing;
    an AC/DC switch for selectively applying a control voltage to the relay based on a position of the AC/DC switch, wherein the position of the AC/DC switch is determined based on a further user selection for energizing the relay;
a processor and a memory coupled to the processor, the memory storing instructions, when executed by the processor, comprising functionality for:
 detecting an energize status signal from the energize test selector switch; and
 testing, based at least on the energize status signal, a control coil or a contact of the relay to generate a test result; and
a display for displaying the energize status signal and the test result.

8. The testing device according to claim 7, further comprising:
 identifying an additional coil or an additional contact of the relay for testing;
 testing, in response to said identifying, the additional coil or the additional contact to generate an additional test result; and
 further displaying, contemporaneously with displaying the energize status signal and the test result, the additional test result.

9. The testing device according to claim 7, wherein the relay comprises 11 pins.

10. The testing device according to claim 7, wherein the position of the selector switch comprises an energized test position and a de-energized test position.

11. The testing device according to claim 7, wherein the position of the AC/DC switch comprises an AC control voltage position and a DC control voltage position.

12. The testing device according to claim 11, wherein the control voltage comprises a 120 VAC voltage based on the AC control voltage position and a 120 VDC voltage based on the DC control voltage position.

13. A non-transitory computer readable medium (CRM) storing instructions executable by a computer processor for testing a relay, the instructions, when executed by the computer processor, comprising functionality for:
 applying power to a testing device for automatically testing the relay;
 determining a position of a selector switch based on a user selection for testing;
 selectively energizing the relay based on the position of the selector switch, comprising:
  determining a position of an AC/DC switch based on a further user selection for energizing the relay; and
 applying a control voltage to the relay based on the position of the AC/DC switch;
 detecting an energize status signal from the selector switch;
 testing, based at least on the energize status signal, a control coil or a contact of the relay to generate a test result; and
 displaying, using a display, the energize status signal and the test result.

14. The non-transitory CRM according to claim 13, the instructions, when executed by the computer processor, further comprising functionality for:
 identifying an additional coil or an additional contact of the relay for testing;
 testing, in response to said identifying, the additional coil or the additional contact to generate an additional test result; and
 further displaying, contemporaneously with displaying the energize status signal and the test result, the additional test result.

15. The non-transitory CRM according to claim 13, wherein the relay comprises 11 pins.

16. The non-transitory CRM according to claim 13, wherein the position of the selector switch comprises an energized test position and a de-energized test position.

17. The non-transitory CRM according to claim 13,
 wherein the position of the AC/DC switch comprises an AC control voltage position and a DC control voltage position, and
 wherein the control voltage comprises a 120 VAC voltage based on the AC control voltage position and a 120 VDC voltage based on the DC control voltage position.

18. A method for automatically testing a relay, the method comprising:
 applying power to a testing device for automatically testing the relay, wherein the relay comprises 11 pins;
 determining a position of a selector switch based on a user selection for testing;
 selectively energizing the relay based on the position of the selector switch;
 detecting, by a hardware processor, an energize status signal from the selector switch;
 testing, by the hardware processor and based at least on the energize status signal, a control coil or a contact of the relay to generate a test result; and
 displaying, using display, the energize status signal and the test result.

* * * * *